United States Patent [19]
Tanaka et al.

[11] Patent Number: 5,875,804
[45] Date of Patent: Mar. 2, 1999

[54] SUBSTRATE TREATING APPARATUS

[75] Inventors: Masato Tanaka; Teruyuki Kobayashi, both of Shiga-ken, Japan

[73] Assignee: Dainippon Screen Manufacturing Co., Ltd., Japan

[21] Appl. No.: 877,008

[22] Filed: Jun. 16, 1997

[30] Foreign Application Priority Data

Jun. 28, 1996 [JP] Japan ................................. 8-169129

[51] Int. Cl.$^6$ ........................................................ B08B 3/04
[52] U.S. Cl. ........................................... 134/182; 134/902
[58] Field of Search ..................................... 134/902, 182

[56] References Cited

U.S. PATENT DOCUMENTS

| | | | |
|---|---|---|---|
| 4,735,220 | 4/1988 | Chandler | 134/902 X |
| 5,226,437 | 7/1993 | Kamikawa et al. | 134/902 X |
| 5,503,171 | 4/1996 | Yokomizo et al. | 134/182 |
| 5,540,247 | 7/1996 | Kawatani et al. | 134/182 |

Primary Examiner—Philip R. Coe
Attorney, Agent, or Firm—Ostrolenk, Faber, Gerb & Soffen, LLP

[57] ABSTRACT

A substrate treating apparatus adapted for treating a substrate with treating fluid therein, the substrate treating apparatus includes a processing bath; a baffle plate with a plurality of holes disposed therein for dividing the processing bath into an upper region and a lower region, the holes allowing communication of the treating liquid between the upper region and the lower region. The baffle plate is composed of a material exhibiting a property that the contact angle of a bubble generated in the treating liquid with respect to the baffle plate is smaller than a predetermined value.

12 Claims, 4 Drawing Sheets

SUBSTRATE TREATING APPARATUS

BACKGROUND OF THE INVENTION

This invention relates to a substrate treating apparatus in which a certain treatment such as cleaning is conducted to front and rear surfaces of substrates such as semiconductor substrates and glass substrates for liquid crystals by immersing the substrates in a certain treating liquid.

In a process of manufacturing substrates such as semiconductor substrates and glass substrates for liquid crystals for use in precision electronic products, there has been known a conventional technology of a substrate treating apparatus wherein a substrate is immersed sequentially in a number of processing baths each filled with a certain type of treating liquid to conduct a surface treatment onto the front and rear surfaces of the substrate.

An example of such conventional apparatus is described below. The conventional substrate treating apparatus is provided with a liquid supply system. With use of such liquid supply system, a treating liquid is continuously supplied to a processing bath in which substrates to be treated are immersed in the treating liquid overflowing the processing bath. Thereby, any contaminants generated during the surface treatment or adhered on the surfaces of the substrates are discharged out of the processing bath together with the overflowing treating liquid. The thus discharged treating liquid is subjected to filtration with a filter or equivalent to remove the contaminants therefrom. Then, the treating liquid free of such contaminants is introduced to the processing bath again. In this way, the treating liquid is purified (refined) and circulated for repeated use after having been removed of the contaminants by the filtration.

Generally, in the above-mentioned apparatus using the liquid overflow method, the processing bath is equipped with a nozzle at a bottom portion thereof to supply a treating liquid. The treating liquid is supplied to the processing bath through the nozzle. However, merely providing the nozzle in the processing bath and causing the treating liquid to be supplied through the nozzle into the processing bath cannot supply the treating liquid in a stable manner, because the stream of treating liquid in the processing bath becomes disturbed with the supply of liquid. In other words, the surface treatment for the substrate becomes uneven (portion by portion) on the front and rear surfaces of the substrate due to an unstable stream of liquid, which may result in a failure of uniformity in the surface treatment on the substrate.

In order to eliminate the above drawback, generally, the processing bath is internally provided with a baffle plate in a plate form with a number of holes therein. The baffle plate is adapted for regulating the unstable stream of treating liquid supplied from the nozzle and allows the treating liquid to uniformly flow upward in the processing bath through the number of holes.

Generally, the baffle plate is composed of a resin material which is excellent in chemical resistance (resistance to corrosion). An example of such resin is polytetrafluoroethylene (PTFE). By using a baffle plate made of such a resin, the generation of contaminants resulting from erosion of the baffle plate caused by a chemical reaction with the treating liquid in the processing bath is prevented.

Due to the overflow of the treating liquid and other various factors, bubbles are likely to be introduced in the treating liquid which is being continuously supplied to the processing bath. Such bubbles are normally moved upward in a floated state by buoyancy and discharged in the air during the overflow of liquid. However, in the above constructed substrate treating apparatus provided with the baffle plate, some of the bubbles does not flow upward through the holes of the baffle plate due to the existence of the baffle plate and are adhered to an underside surface of the baffle plate. As the surface treatment is carried on, the adhered small bubbles are accumulated on the underside surface of the baffle plate. When the bubbles collect beyond a certain limit under the baffle plate, they abruptly depart from the underside surface of the baffle plate and move up in the treating liquid above the baffle plate through the holes during the surface treatment.

It should be noted that a non-negligible amount of contaminants which have been generated during the surface treatment are floating in the treating liquid. As the above mentioned bubbles proceed upward, these contaminants are also carried upward with bubbles. The contaminants carried by the bubbles proceeding upward are transferred onto a surface of the substrate and stay on the surface, and then oxygen contained in the bubbles is reacted with the substrate to generate contaminants which are likely to be adhered on the surface of the substrate. In this way, when bubbles, however small they may be in size, are trapped under the baffle plate and suddenly move upward through the holes of the baffle plate in a mass state, they adversely affect the surface treatment of the substrate beyond a permissible range.

SUMMARY OF THE INVENTION

In view of the above, it is an object of the invention to solve the above drawbacks of the prior art.

It is another object of the invention to provide a substrate treating apparatus capable of suppressing the influence of bubbles to a substrate by effectively suppressing trapping of the bubbles under a baffle plate provided in a processing bath.

In order to achieve the above objects, a substrate treating apparatus according to this invention comprises a processing bath to be filled with the treating liquid; a baffle plate disposed in the processing bath, dividing the processing bath into an upper region and a lower region, said baffle plate being formed with a plurality of holes allowing communication of the treating liquid between the upper region and the lower region and said baffle plate being composed of a material having a property such that a contact angle of a bubble generated in the treating liquid with respect to the baffle plate is smaller than a predetermined value.

The substrate treating apparatus thus constructed includes the baffle plate made of such material having a higher wettability. Thus bubbles generated in the lower region of the processing bath when treatment liquid is supplied thereto tend to be trapped less than the case when the baffle plate is made of other material with a higher contact angle than the predetermined value. The fewer the bubbles trapped under the baffle plate in the processing bath, the less chances that the trapped bubbles in mass will abruptly move up to the upper region of the processing bath, causing the floating contaminants to move up together, resulting in an adverse effect on the surface of the substrate being treated in the processing bath.

Preferably, the predetermined value of the contact angle of the bubble in the treating liquid filling the processing bath with respect to the lower surface of the baffle plate is set at 90 degrees. Moreover one of the materials having such material property may be PEEK (polyether ether ketone).

With this material, PEEK, for the baffle plate, the tendency for the bubbles to be trapped is significantly lessened.

In addition, the likelihood of the contaminants constituting the surface of the baffle plate to come off and get liquefied into the treating fluid (liquid) in the processing bath can be effectively avoided, which in turn results in maintaining the superior quality in the surface treatment of the substrate.

The above and other objects, features and advantages of the present invention will become more apparent upon a reading of the following detailed description and drawings.

DETAILED DESCRIPTION OF THE PREFERRED EMBODIMENTS OF THE INVENTION

A preferred embodiment of this invention is described with reference to the accompanying drawings.

Figure 1:
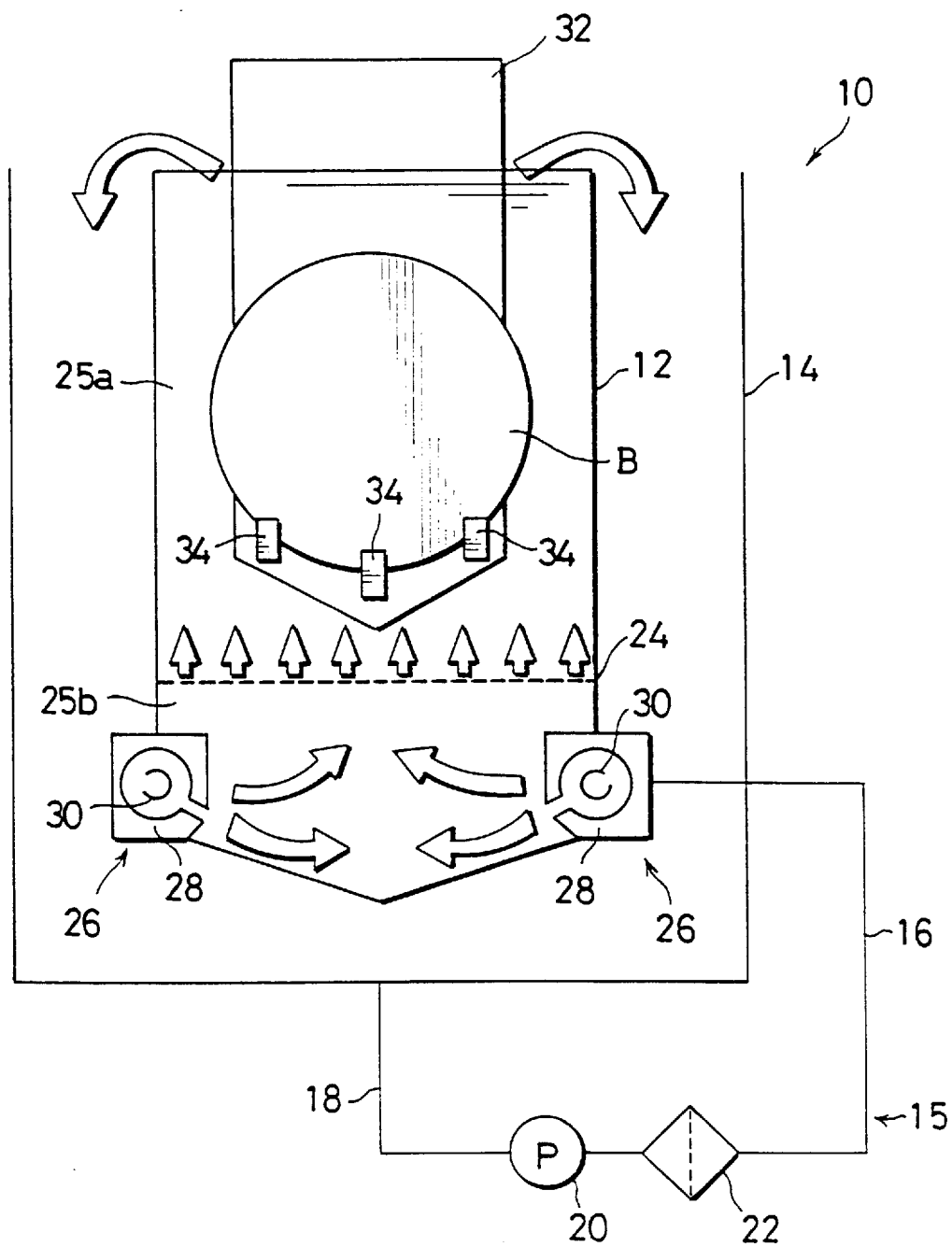
FIG. 1 is an explanatory view showing an embodiment of a processing bath for use in a substrate treating apparatus according to the present invention.

FIG. 1 is an explanatory view showing an embodiment of a processing bath for use with a substrate treating apparatus according to the present invention. As shown in FIG. 1, a substrate treating apparatus 10 is provided with a processing bath 12. A substrate B is subjected to a certain treatment by being immersed in a treating liquid which fills the processing bath 12. In this embodiment, the processing bath 12 is filled with a solution of hydrofluoric acid (HF acid) in which the substrate B (such as a semiconductor wafer) is immersed. Thereby, etching is conducted to the front and rear surfaces of the substrate B.

The processing bath 12 is a top open box-like vessel. As shown in FIG. 1, the processing bath 12 is arranged inside of a drainage bath 14 larger than the processing bath 12. Between the processing bath 12 and the drainage bath 14, there is a liquid circulation system 15 comprising a treating liquid introducing pipe 16, a liquid discharging pipe 18, a pump 20 and a filter 22 in series.

By activation of the pump 20, treating liquid is supplied to the processing bath 12 via the filter 22 to overflow the processing bath 12. The overflowing liquid is received in the drainage bath 14, and is introduced to the pump 20 via the liquid discharging pipe 18. Then, the used treating liquid which is introduced to the pump 20 is subjected to filtration by the filter 22 and drawn to the processing bath 12 again via the liquid introducing pipe 16. Thus, the substrate treating apparatus 10 is constructed such that treating liquid is circulated in the liquid circulation system 15 for repeated use while being subjected to purification at a point along the liquid circulation system 15.

The processing bath 12 has, e.g., a rectangular shape in cross section, and is composed of quartz glass or polytetrafluoroethylene resin (PTFE) which has a chemical resistance (resistance to corrosion) in its entirety. The processing bath 12 is internally provided with a baffle plate 24 for dividing the inside of the processing bath 12 into two parts, i.e., upper portion (substrate processing portion) 25a and lower portion (liquid supply portion) 25b. The substrate B is immersed in the substrate processing portion 25a for surface treatment.

The liquid supply portion 25b is arranged with a pair of nozzles 26, 26 disposed at right and left sides in FIG. 1. Similar to the processing bath 12, the nozzles 26, 26 are also composed of quartz glass or PTFE.

The nozzles 26 (26) have a double-layer structure. Specifically, the nozzle 26 includes an outer tube 28 having an outlet (in the form of opening) facing toward inside of the processing bath 12, and an inner tube 30 having an opening facing substantially opposite to the outlet opening of the outlet of the outer tube. The outer tube 28 and the inner tube 30 are concentrically disposed with each other. The inner tube 30 is connected to the liquid introducing pipe 16 of the liquid circulation system 15.

In immersing the substrate B in the overflowing treating liquid, the treating liquid which is introduced to the processing bath 12 via the liquid introducing pipe 16 is first drawn to the inner tube 30 and flows to the outer tube 28 through the opening of the inner tube 30. The treating liquid supplied to the outer tube 28 flows out to the processing bath 12 through the outlet thereof. In this way, the treating liquid is continuously supplied to the processing bath 12 to maintain overflow state of the processing bath with treating liquid. The overflowing treating liquid from the top is running down along the side of the processing bath into the drainage bath 14.

The baffle plate 24 has a plate-like shape and is provided with a number of through holes vertically communicating with the inside of the processing bath 12. The treating liquid dispensed from the nozzles 26, 26 is introduced into the substrate processing portion 25a via the through holes of the baffle plate 24. Thereby, an occurrence of turbulence or whirlpool of treating liquid can be prevented, and a uniform upward stream of treating liquid can be obtained in the substrate processing portion 25a.

The baffle plate 24 in its entirety is composed of polyether ether ketone (PEEK) which has a chemical resistance (resistance to corrosion) and which can improve wettability of the baffle plate.

In the substrate treating apparatus 10, the substrate B is supported by a handling device 32 which is vertically and horizontally movable with respect to the processing bath 12. Specifically, horizontal movement is such that the handling device 32 is moved in a direction parallel to the plane of FIG. 1, i.e., in a direction parallel to the surface of the substrates above the processing bath 12, and vertical movement is such that the handling device 32 is moved upward and downward in FIG. 1. With the elevational movement of the handling device 32, the substrate B can be immersed into and taken out from the processing bath 12.

Although not illustrated in detail, the handling device 32 is provided with support members 34. The support members 34 are adapted for supporting a number of substrates in an aligned state separated by a certain distance along the orientation normal to the plane in FIG. 1. In applying surface treatment, these substrates, which are disposed in an aligned state and supported by the support members 34 of the handling device 32, are integrally moved upward and downward in accordance with an elevational movement of the handling device 32.

The above described substrate treating apparatus 10 is operated as follows. By activating the liquid circulation system 15, treating liquid is supplied to the processing bath 12 to fill the bath 12 with the treating liquid. Subsequently, a number of substrates B are simultaneously immersed in the treating liquid by a downward movement of the handling device 32 to apply a specified treatment to the front and rear surfaces of the substrates B. At this time, since the treating liquid is continuously supplied to the processing bath 12, the processing bath 12 overflows with the treating liquid. Thereby, contaminants which have been generated by the treatment are discharged out of the processing bath 12 and drawn into the drainage bath 14 together with the overflowing treating liquid. The overflowing treating liquid which is drawn in the drainage bath 14 is fed to the processing bath 12 again via a specified circulation path of the liquid circulation system 15.

Upon completion of the treatment in a set condition, e.g., after a specified time elapses, the handling device 32 is moved upward to take out the immersed substrates B from the processing bath 12. Then, accompanied by a horizontal movement of the handling device 32, the substrates B after the treatment are transported to a processing bath in a succeeding step.

As mentioned above, in the substrate treating apparatus 10, the treating liquid dispensed from the nozzles 26, 26 is introduced to the substrate processing portion 25a via the baffle plate 24. When bubbles are intruded during the supply of treating liquid into the processing bath 12 through the nozzles 26, 26, they are trapped under the baffle plate 24 and collected there. When these bubbles accumulate beyond a certain point, they abruptly flow upward into the substrate processing portion 25a through the holes of the baffle plate 24. When such a phenomenon occurs, there is a possibility that these bubbles will combine with contaminants already existing in the substrate processing portion 25a and adversely affect the surface treatment of the substrates B.

Figure 4A:
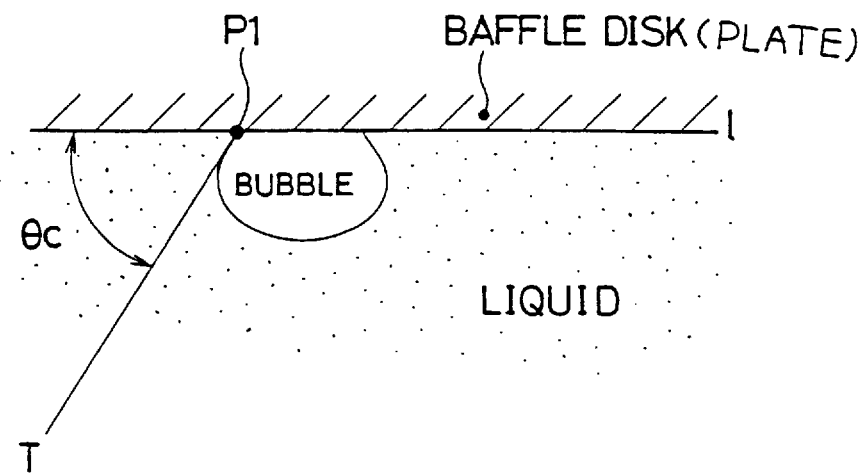
FIG. 4A is a diagram showing a way to measure a contact angle of the bubble in the liquid with respect to the baffle plate.

However, the baffle plate 24 is composed of polyether ether ketone (PEEK) which can improve wettability of the baffle plate. The wettability of the baffle plate has a positive relationship with the contact angle of a bubble in a liquid with respect to the baffle plate composed of a certain material. Specifically, the contact angle of a bubble in the treating liquid with respect to the baffle plate 24 composed of PEEK is smaller than some other materials. It should be noted that the term contact angle $\Theta_c$ of the bubble in the liquid with respect to the baffle plate used throughout this specification is defined by an angle between a tangent line T, extending from a point P1 along a boundary between the bubble and the surrounding liquid, and a line l corresponding to the under surface of the baffle plate (see FIG. 4A). Accordingly, bubbles coming close to the baffle plate can hold its spherical posture (retain its surface tension) as much as possible, and thus are not liable to be adhered to the baffle plate 24. In other words, when the baffle plate is composed of PEEK, a property to repel bubbles is given to the baffle plate. Thus, the above undesirable phenomenon due to adhesion of bubbles to the underside surface of the baffle plate 24 can be effectively prevented.

Figure 2:
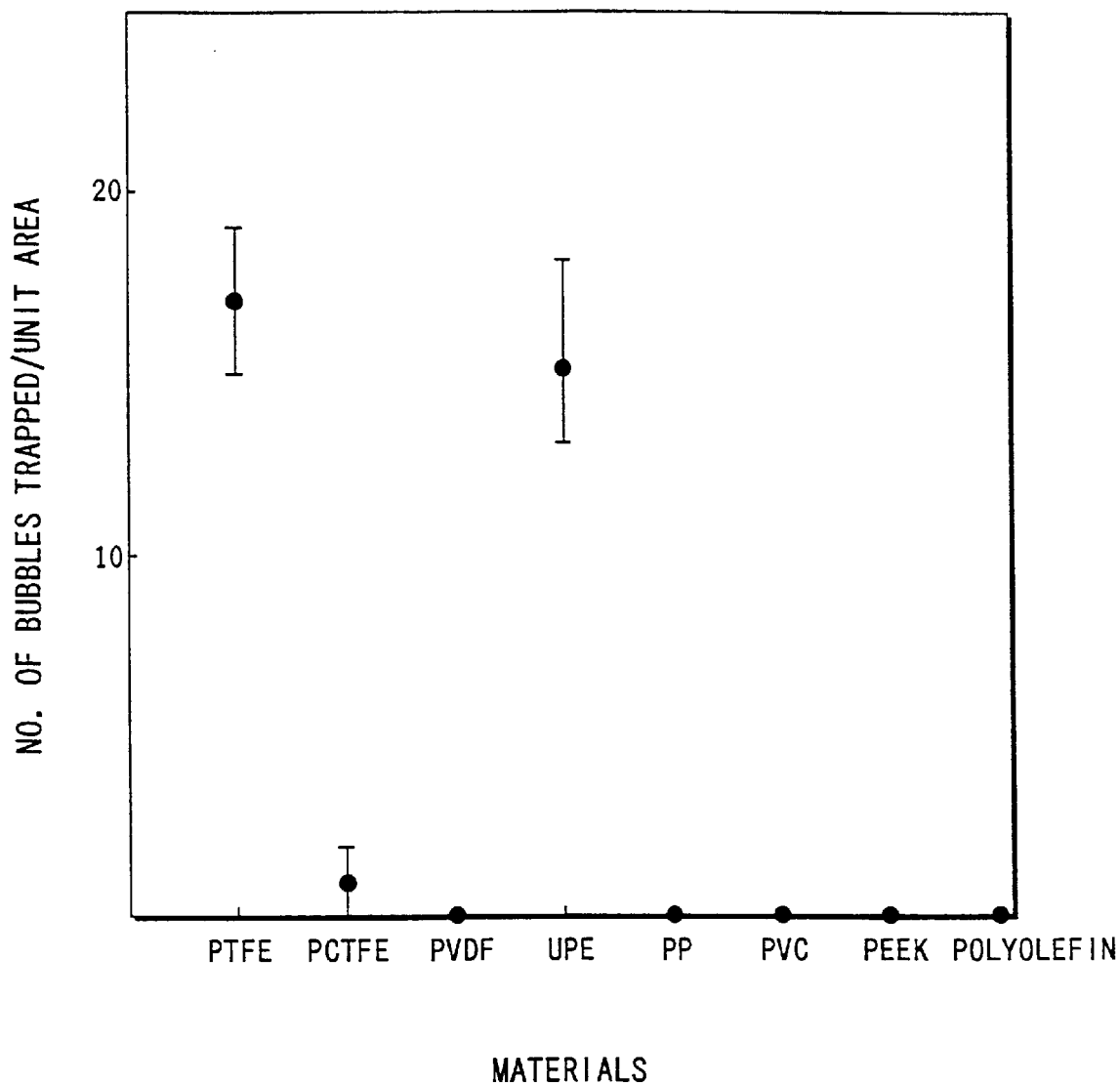
FIG. 2 is a diagram showing an experimental data on the number of bubbles adhered on a surface of a baffle plate per unit area when various materials are used for the baffle plate.
Figure 3:
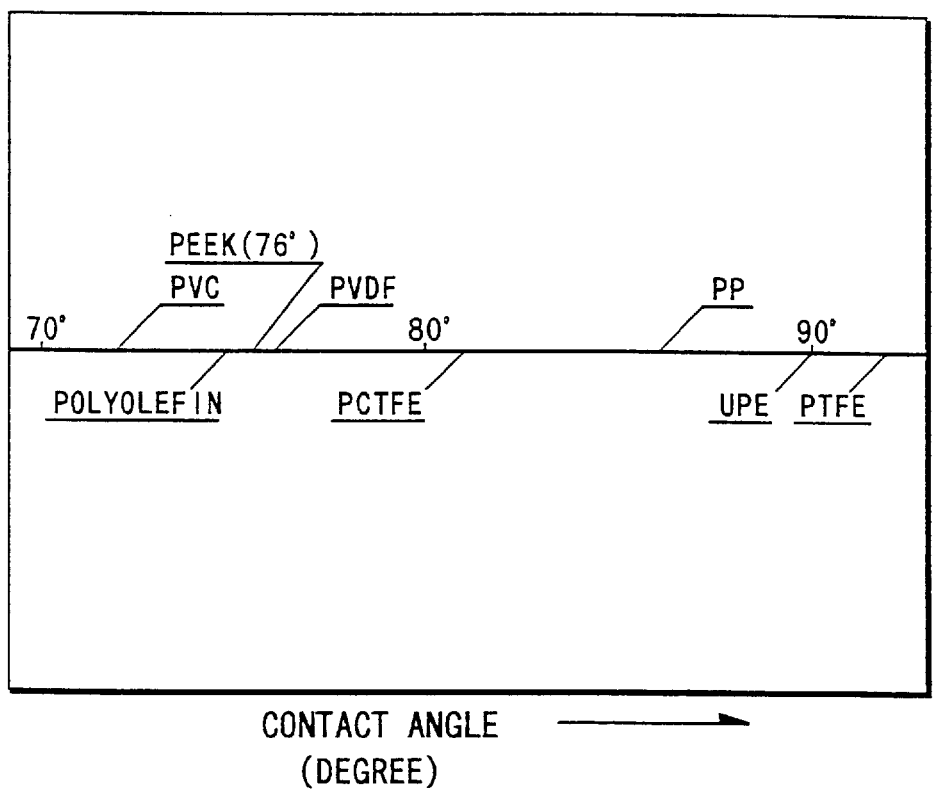
FIG. 3 is a diagram showing a contact angle of a bubble in a treating liquid with respect to baffle plates composed of the various materials.

FIG. 2 is a diagram of an experimental data showing how the number of bubbles adhered on a surface of a baffle plate per unit area is varied when a variety of materials are used for the baffle plate. The materials used in this experiment are: polyether ether ketone (PEEK), polytetrafluoroethylene (PTFE), ultra high molecular weight polyethylene (UHMWPE), polypropylene (PP), polychlorotrifluoroethylene (PCTFE), polyvinylidene fluoride (PVDF), polyvinyl chloride (PVC), and polyolefin. FIG. 3 is a graph showing the contact angle of the bubble in the treating liquid with respect to the baffle plate composed of these various materials.

Figure 4B:
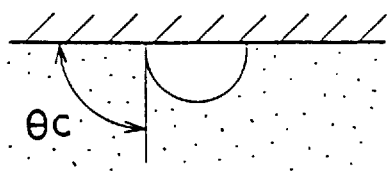
FIGS. 4B and 4C are diagrams showing cases of contact angles of 90 degrees and of less than 90 degrees respectively.
Figure 4C:
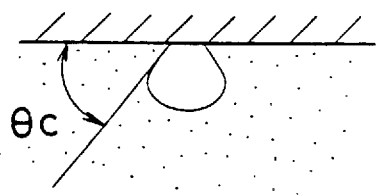

As can be clearly seen from FIGS. 2 and 3, compared to the baffle plate made of PTFE (contact angle of 90° ; see FIG. 4B), which is one of the most commonly used materials for baffle plate, the baffle plate 24 (contact angle of 76° ; see FIG. 4C) made of PEEK is effective in suppressing trapping of bubbles under the baffle plate. This is because the contact angle of the bubble in the treating liquid with respect to the baffle plate composed of PEEK is smaller than that with respect to the other kinds of baffle plates composed of materials other than PEEK. In other words, wettability of the baffle plate 24 composed of PEEK is higher than that of the baffle plates composed of the other materials.

According to the substrate treating apparatus 10, there can be effectively suppressed trapping of bubbles under the baffle plate 24. Hence, there can be effectively eliminated a phenomenon that bubbles which have been cumulatively collected at the underside surface of the baffle plate unexpectedly flow upward in a mass during a certain treatment. Compared to the conventional apparatus using the baffle plate composed of the material, e.g., PTFE whose wettability is low, in the substrate treating apparatus 10, there can be greatly avoided adverse effects to substrates due to generation of bubbles. Thus, substrates of higher quality are obtainable.

It is to be understood that the above substrate treating apparatus 10 is merely one of the preferred embodiments of this invention and that the invention is not limited to the specific embodiments thereof without departing from the spirit and scope thereof.

In the above embodiment, the substrate treating apparatus 10 adopts the baffle plate 24 composed of PEEK. However, as shown by the experimental data in FIGS. 2 and 3, adhesion of bubbles to the baffle plate composed of PP, PCTFE, PVDF, PVC, or polyolefin can be suppressed substantially to the same level as the baffle plate 24 composed of PEEK. Accordingly, the materials such as PP, PCTFE, PVDF, PVC, and polyolefin may be used for producing the baffle plate. The reason for adopting PEEK for the baffle plate in the above preferred embodiment is as follows. PEEK has a low rate of containing impurities such as chrome, nickel, iron and copper, compared to PP, PCTFE, PVDF, PVC, and polyolefin, and the degree of elusion of these impurities contained in PEEK into the treating liquid is small. Accordingly, in the aspect of suppressing generation of contaminants to the level as low as possible, it is desirable to use baffle plates composed of PEEK.

From the experimental data in FIGS. 2 and 3, it can be understood that adhesion of bubbles can be effectively suppressed when the contact angle of the bubble in the treating liquid with respect to the baffle plate is less than 90°. Accordingly, any material other than PEEK, PP, PCTFE, PVDF, PVC, and polyolefin may be used for the baffle plate, as far as the contact angle is less than 90°. The treating liquid used in the experiment data in FIG. 2 is a solution of HF acid. However, similar to the case that a solution of HF acid is used as the treating liquid, there is a tendency that the contact angle of a bubble in a treating liquid other than a solution of HF acid with respect to the baffle plate made of PEEK (and other materials) becomes small. Accordingly, it is desirable to use the baffle plate 24 composed of a material which can obtain the contact angle of less than 90° (e.g., PEEK) also in the substrate treating apparatuses in which a treating liquid other than an HF acid solution is used.

In the above embodiment, the baffle plate 24 in its entirety is composed of PEEK. Alternatively, PEEK may be used partially for the baffle plate on which bubbles are likely to be trapped, e.g., underside surface of the baffle plate or inner circumferential portions of through holes of the baffle plate.

In the foregoing embodiment, the substrate treating apparatus 10 is constructed in such a way that one kind of treating liquid is supplied to the processing bath 12 by circulating the liquid through the specified circulation path, thereby applying a certain treatment to substrates B. Alternatively, the arrangement of this invention is applicable to a substrate treating apparatus in which a plurality of kinds of treatments, e.g., etching and rinsing, are performed in a single processing bath by alternately supplying a plurality of kinds of treating liquids for the respective treatments in the processing bath.

In the above case, a material may be selected in such a way that the material can improve wettability of baffle plate, i.e., in such a way that the contact angle with respect to all of these treating liquids may become adequately small.

The present invention is particularly effective in processing wafers made of silicon using an HF acid solution or a buffered HF acid solution (solution of a mixture of HF and NH$_4$F) for the following reason. In treating wafers with HF acid solution or buffered HF acid solution, an oxide film on the wafers is peeled off and silicon underneath the oxide film is exposed to the treating liquid. In this state, when bubbles come into contact with a surface of the wafers at a portion, the silicon at the contact surface is reacted with oxygen contained in the bubbles, thereby generating undesired oxides film on the surface of the wafers at a portion.

Although the present invention has been fully described by way of example with reference to the accompanying drawings, it is to be understood that various changes and modifications will be apparent to those skilled in the art. Therefore, unless otherwise such change and modifications depart from the scope of the invention, they should be construed as being included therein.

What is claimed is:

1. A substrate treating apparatus adapted for treating a substrate comprising:

a processing bath for being filled with a treating liquid;

a baffle plate disposed in the processing bath and dividing the processing bath into an upper region and a lower region, the baffle plate being formed with a plurality of holes therethrough allowing communication of the treating liquid between the upper region and the lower region and the baffle plate being formed from polyether ether ketone such that a contact angle of a bubble generated in the treating liquid with respect to the baffle plate is smaller than a predetermined value.

2. A substrate treating apparatus according to claim 1, wherein the predetermined value is 90° degree.

3. A substrate treating apparatus adapted for treating a substrate comprising:

a processing bath for being filled with a treating liquid;

a baffle plate disposed in the processing bath and dividing the processing bath into an upper region and a lower region, the baffle plate being formed with a plurality of holes therethrough allowing communication of the treating liquid between the upper region and the lower region and the baffle plate being formed from polyvinylidene fluoride such that a contact angle of a bubble generated in the treating liquid with respect to the baffle plate is smaller than a predetermined value.

4. A substrate treating apparatus adapted for treating a substrate comprising:

a processing bath for being filled with a treating liquid;

a baffle plate disposed in the processing bath and dividing the processing bath into an upper region and a lower region, the baffle plate being formed with a plurality of holes therethrough allowing communication of the treating liquid between the upper region and the lower region and the baffle plate being formed from polypropylene such that a contact angle of a bubble generated in the treating liquid with respect to the baffle plate is smaller than a predetermined value.

5. A substrate treating apparatus according to claim 2 further comprising a liquid supply unit attached to a bottom of the processing bath for supplying the treating liquid from the bottom of the processing bath such that the treating liquid circulates through the holes formed in the baffle plate.

6. A substrate treating apparatus according to claim 5, wherein the liquid supply unit includes an inner tube and an outer tube which are concentrically arranged, the inner tube being formed with a first opening and the outer tube being formed with a second opening such that the treating liquid communicates between the inner tube and the outer tube.

7. A substrate treating apparatus according to claim 6, wherein the first opening is arranged opposite to the second opening with respect to a center axis of the inner tube.

8. A substrate treating apparatus adapted for treating a substrate comprising:

a processing bath for being filled with a treating liquid;

a baffle plate disposed in the processing bath and dividing the processing bath into an upper region and a lower region, the baffle plate being formed with a plurality of holes therethrough allowing communication of the treating liquid between the upper region and the lower region and the baffle plate being formed from a material having a property such that a contact angle of a bubble generated in the treating liquid with respect to the baffle plate is smaller than a predetermined value, the material being taken from the group consisting of polyvinylidene fluoride, polypropylene, polyolefin, and polychlorotrifluoroethylene.

9. A substrate treating apparatus according to claim 5, wherein the polyether ether ketone is disposed on a surface of the baffle plate which faces the liquid supply unit.

10. A substrate treating apparatus according to claim 5, wherein the polyether ether ketone is disposed on a bottom surface of the baffle plate.

11. A substrate treating apparatus according to claim 1, wherein the baffle plate is formed entirely of the polyether ether ketone.

12. A substrate treating apparatus according to claim 1, wherein the contact angle is the angle formed between a first line extending along the surface of the baffle plate to which the bubble would adhere and a second line extending tangentially from an edge of the bubble contacting the surface of the baffle plate along a boundary between the bubble and the surrounding treating liquid.

* * * * *